US011114978B2

(12) United States Patent
Perin et al.

(10) Patent No.: US 11,114,978 B2
(45) Date of Patent: Sep. 7, 2021

(54) VARIABLE REACTANCE APPARATUS FOR DYNAMIC GAIN SWITCHING OF TUNABLE OSCILLATOR

(71) Applicant: NXP B.V., Eindhoven (NL)

(72) Inventors: Mathieu Perin, Cairon (FR); Stefano Dal Toso, Antibes (FR)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/061,887

(22) Filed: Oct. 2, 2020

(65) Prior Publication Data
US 2021/0126584 A1    Apr. 29, 2021

(30) Foreign Application Priority Data

Oct. 24, 2019  (EP) .................................... 19306383

(51) Int. Cl.
*H03B 5/12*   (2006.01)
*H03C 3/09*   (2006.01)

(52) U.S. Cl.
CPC ........... *H03B 5/1228* (2013.01); *H03B 5/124* (2013.01); *H03B 5/1212* (2013.01); *H03B 5/1215* (2013.01); *H03B 5/1253* (2013.01); *H03B 5/1265* (2013.01); *H03B 5/1293* (2013.01); *H03C 3/0941* (2013.01); *H03C 3/0966* (2013.01); *H03B 2201/0208* (2013.01)

(58) Field of Classification Search
CPC .. H03B 5/1253; H03B 5/1215; H03B 5/1293; H03B 5/1228; H03B 2201/0208; H03B 5/124; H03B 5/1265; H03B 5/1212; H03C 3/0941; H03C 3/0966

USPC ................................... 331/117 FE, 183, 167
See application file for complete search history.

(56) References Cited

U.S. PATENT DOCUMENTS

| | | | |
|---|---|---|---|
| 7,358,823 B2* | 4/2008 | Abadeer | H03L 7/095 |
| | | | 331/177 V |
| 7,612,626 B2 | 11/2009 | Tang | |
| 8,120,440 B2 | 2/2012 | Craninckx et al. | |
| 8,169,270 B2 | 5/2012 | Zeng et al. | |
| 8,912,857 B2 | 12/2014 | Beaulaton et al. | |

(Continued)

FOREIGN PATENT DOCUMENTS

| | | |
|---|---|---|
| EP | 1988628 A1 | 11/2008 |
| JP | 2007-13898 A | 1/2007 |

(Continued)

*Primary Examiner* — Arnold M Kinkead (57) ABSTRACT

A variable reactance apparatus, tunable oscillator and method for changing a gain associated with an input signal of a tunable oscillator are disclosed. An embodiment of the variable reactance apparatus includes a plurality of unit variable reactance structures including respective control input nodes, and a control circuit configured to connect each of the control input nodes to a respective signal from among a plurality of signals including a first tuning signal and a second tuning signal. An embodiment of a tunable oscillator includes a resonance circuit, a negative impedance structure and a variable reactance apparatus configured for tuning of the oscillator. An embodiment of a method includes altering connections of first and second tuning signals to control input nodes of respective first and second sets of unit variable reactance structures while holding constant a sum of the number of unit variable reactance structures in the first and second sets.

19 Claims, 7 Drawing Sheets

(56) References Cited

U.S. PATENT DOCUMENTS

| | | |
|---|---|---|
| 9,379,721 B2 | 6/2016 | Pavao-Moreira et al. |
| 9,935,640 B1 | 4/2018 | Chan |
| 2006/0208806 A1 | 9/2006 | Chien |
| 2007/0146082 A1 | 6/2007 | Ohara et al. |
| 2012/0081188 A1 | 4/2012 | Liu et al. |

FOREIGN PATENT DOCUMENTS

| | | | |
|---|---|---|---|
| KR | 10-2011-0092808 A | | 8/2011 |
| WO | PCT-2017/217984 A1 | | 12/2017 |

\* cited by examiner

| Sig_1_ctrl | Cal_enab | Sig_2_ctrl | V_port_sel 1 2 3 4 5 6 7 8 9 10 11 12 | V_on_sel 1 2 3 4 5 6 7 8 9 10 11 12 |
|---|---|---|---|---|
| 2 | 0 | 10 | 1 1 0 0 0 0 0 0 0 0 0 0 | 1 1 1 1 1 1 1 1 1 1 1 1 |
| 4 | 1 | 10 | 1 1 1 1 0 0 0 0 0 0 0 0 | 1 1 1 1 1 1 1 1 1 1 1 1 |
| 8 | 1 | 10 | 1 1 1 1 1 1 1 1 0 0 0 0 | 1 1 1 1 1 1 1 1 1 1 1 1 |
| 2 | 0 | 8 | 1 1 0 0 0 0 0 0 0 0 x x | 1 1 1 1 1 1 1 1 1 1 0 0 |
| 4 | 1 | 8 | 1 1 1 1 0 0 0 0 0 0 x x | 1 1 1 1 1 1 1 1 1 1 0 0 |
| 8 | 1 | 8 | 1 1 1 1 1 1 1 1 0 0 x x | 1 1 1 1 1 1 1 1 1 1 0 0 |

VARIABLE REACTANCE APPARATUS FOR DYNAMIC GAIN SWITCHING OF TUNABLE OSCILLATOR

CROSS-REFERENCE TO RELATED APPLICATIONS

This application claims the priority under 35 U.S.C. § 119 of European Patent application no. 19306383.1, filed on 24 Oct. 2019, the contents of which are incorporated by reference herein.

BACKGROUND

A tunable oscillator, such as a voltage controlled oscillator (VCO) or current controlled oscillator, has one or more tuning inputs used to control the oscillator's frequency. In certain applications, operation sequences of a tunable oscillator are needed that involve changes in the gain associated with a tuning input. This change in gain generally causes a change in the oscillation frequency, which can reduce the accuracy of a circuit, such as a frequency synthesizer, employing the tunable oscillator.

BRIEF DESCRIPTION OF THE DRAWINGS

It will be appreciated that for simplicity and clarity of illustration, elements illustrated in the figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

An innovative tunable oscillator design disclosed herein employs a variable reactance apparatus allowing structures within a group of unit variable reactance structures to be shared between two or more tuning inputs of the oscillator. In this way, an effective reactance seen by the tunable oscillator can be held substantially constant, even as the gain associated with a particular tuning input is changed. This allows the oscillator frequency to be kept substantially constant while changing the gain associated with a particular tuning input.

Figure 1:
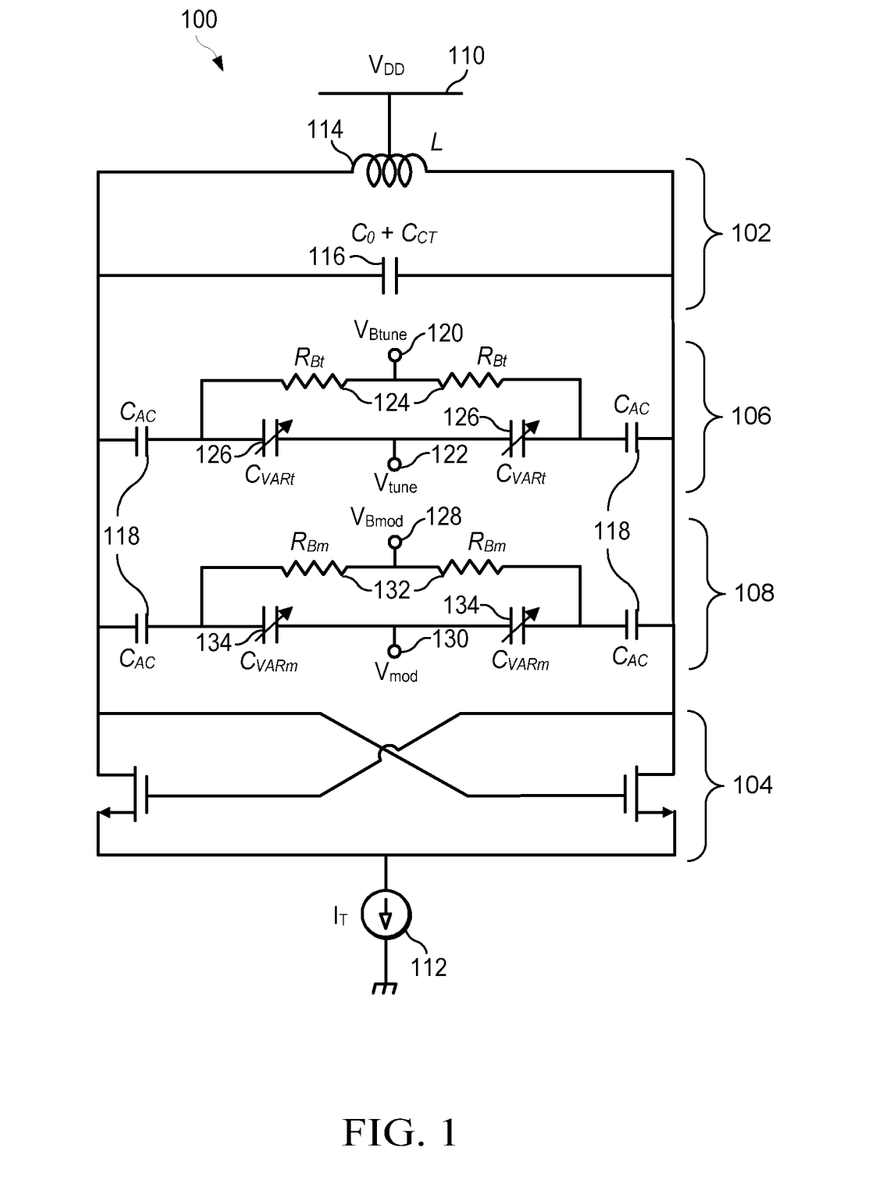
FIG. 1 is a schematic diagram illustrating a voltage controlled oscillator circuit having two tuning inputs.

FIG. 1 illustrates an example of a simplified VCO circuit having two tuning inputs. VCO 100 includes a resonance circuit, or resonator, 102, a negative impedance, or active core, 104, a first tuning input circuit 106 and a second tuning input circuit 108. In the embodiment of FIG. 1, VCO 100 is biased using a supply voltage 110 labeled $V_{DD}$ and a tail current source 112 labeled $I_T$. Resonator 102 is in this embodiment an LC tank circuit. Inductor 114 is labeled L, and capacitor 116 represents a fixed capacitance CO combined with a capacitance $C_{CT}$ from a coarse tuning circuit (not shown). Active core 104 is in this embodiment a cross-coupled NMOS transistor pair.

In the embodiment of FIG. 1, first and second input circuits 106 and 108 are alternating-current (AC) coupled to resonator 102 and active core 104 using AC coupling capacitors 118 labeled $C_{AC}$. The use of AC coupling allows a separate voltage bias to be established for each of tuning input circuits 106 and 108. Input circuit 106, for example, uses a bias voltage 120 labeled $V_{Btune}$, and a control voltage 122 labeled $V_{tune}$. Similarly, input circuit 108 uses a bias voltage 128 labeled $V_{Bmod}$, and a control voltage 130 labeled $V_{mod}$. Voltages $V_{mod}$ and $V_{tune}$ in FIG. 1 are named in accordance with "modulation" and "tuning" voltages customarily defined in connection with a frequency synthesizer application using a two-point injection phase-locked loop (PLL). This application is discussed further below in connection with FIGS. 2 and 3. In general, however, the first and second tuning input circuits of FIG. 1 allow for connection of two tuning voltages 122 and 130, respectively, and corresponding bias voltages 120 and 128.

Bias voltage 120 in input circuit 106 is connected between bias resistors 124 labeled $R_{Bt}$, while bias voltage 128 in input circuit 108 is connected between bias resistors 132 labeled $R_{Bm}$. Control voltage 122 in input circuit 106 is connected between variable capacitors, or varactors, 126 labeled $C_{VARt}$, while control voltage 130 in input circuit 108 is connected between varactors 134 labeled $C_{VARm}$. It is noted that, depending on the application that a VCO like that of FIG. 1 is used for, the bias voltage and component values for input circuit 106 are likely to be different than those for input circuit 108. In addition, though tuning input circuits 106 and 108 are illustrated separately from resonator 102, the tuning circuits are functionally part of the resonator, in the sense that application of control voltages 122 and 130 adjusts the capacitance of the corresponding varactor pair, thereby adjusting the overall equivalent capacitance and the resonant frequency of the tank circuit.

Figure 2:
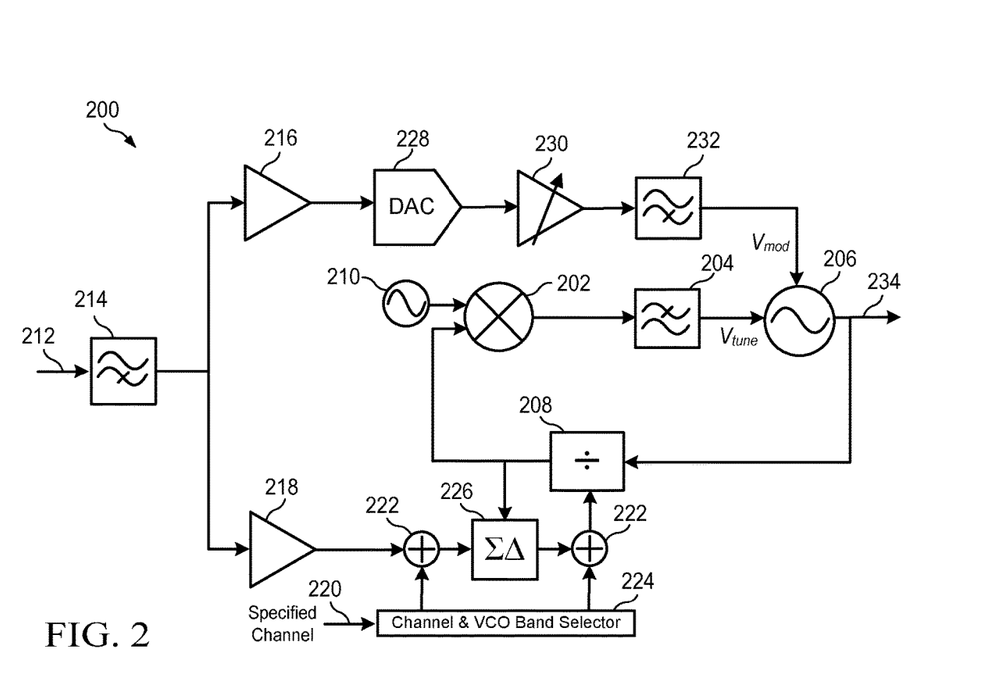
FIG. 2 is a block diagram illustrating a frequency synthesizer circuit including a phase-locked loop with two-point injection.

A simplified block diagram illustrating an example of a frequency synthesizer circuit employing a two-input VCO is shown in FIG. 2. At the heart of synthesizer 200 is a phase-locked loop (PLL) including a phase detector or comparator 202, loop filter 204, VCO 206 and frequency divider 208. Phase comparator 202 compares the phases of a frequency-divided output signal from VCO 206 and reference signal 210, which is provided in some embodiments by a crystal oscillator. The output of phase comparator 202 represents the phase difference between the two input signals, and is input to VCO 206 via loop filter 204. This causes an adjustment to the output of VCO 206, which output is fed back to frequency comparator 202 via divider 208.

Incoming bitstream data 212 is injected into the PLL at two points. Specifically, in the embodiment of FIG. 2, the bitstream passes through pulse shaping filter 214 and is fed to both a high-pass path, with a high-pass path amplifier 216, and a low-pass path with a low-pass path amplifier 218. In the low-pass path, bitstream 212 is combined with a carrier (specified channel 220) and injected into the PLL via adders 222, channel and VCO band selector 224, sigma-delta modulator 226 and divider 208. In the high-pass path, the bitstream data is converted to an analog signal by digital-to-analog converter (DAC) 228, which is scaled by variable gain amplifier (VGA) 230, and passed as a second input to VCO 206, via high-pass anti-aliasing filter 232. Modulated output signal 234 is connected to transmitter circuitry.

In PLL frequency synthesizers using 2-point injection such as that of FIG. 2, also called dual port modulators, the voltage input from the loop filter (via the low-pass path) may be referred to as the tuning voltage, and the corresponding VCO input may be called the tuning port of the VCO. The voltage input from the high-pass path may be referred to as the modulation voltage, and the corresponding VCO input may be called the modulation port of the VCO. This type of frequency synthesizer can advantageously provide a relatively broad frequency response, along with other performance advantages. Two-input VCO 100 of FIG. 1 is an example of a possible embodiment of VCO 206.

Figure 3:
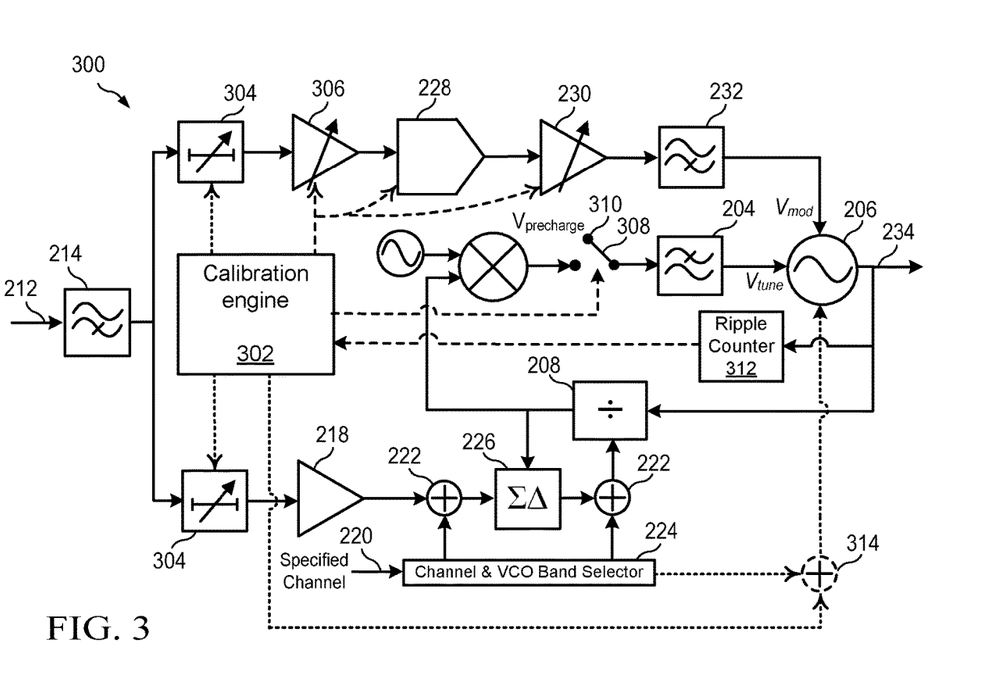
FIG. 3 is a block diagram illustrating the frequency synthesizer circuit of FIG. 2 with additional calibration circuitry.

The block diagram of FIG. 2 is somewhat simplified in order to more clearly show the two-point injection of the modulation data, and the two corresponding inputs to the VCO. The block diagram of FIG. 3 illustrates an embodiment of a frequency synthesizer having additional components for providing calibration functionality. Components of synthesizer 300 in FIG. 3 are the same as similar components of synthesizer 200 in FIG. 2 unless stated otherwise. In some cases reference numbers of components also shown in FIG. 2 are omitted in FIG. 3 to reduce complexity. Calibration engine 302 of synthesizer 300 performs calibration functions to account for differences between the two signal injection paths. In some embodiments, engine 302 performs additional functions such as detecting whether the PLL is locked onto its closed-loop frequency.

One function of engine 302 is to adjust programmable delay elements 304 to compensate for the different delays encountered by incoming bitstream 212 due to components of the low-pass path versus the high-pass path. In the embodiment of FIG. 3, calibration engine 302 is also involved in the coarse tuning of VCO 206 to a selected frequency band, using additional adder 314. In addition, calibration engine 302 adjusts the gain of the high-pass path to match that of the low-pass path, so that the frequency response for synthesizer 300, produced by a combination of the low-pass and high-pass responses of the respective paths, is flat across the entire range. The gain of the low-pass path is steady because it includes only digital components, but the high-pass path has analog components subject to process, voltage and temperature (PVT) variations. This adjustment of the high-pass path gain is done using a calibration procedure performed just prior to transmission. The calibration procedure estimates the actual high-pass gain, determines a correction factor needed to achieve the desired high-pass gain, and adjusts one or more components in the high-pass path to according to the correction factor.

In the embodiment of FIG. 3, the high-pass gain estimation needed for the calibration is done by opening the PLL using switch 308, and applying a reference voltage 310 labeled $V_{precharge}$ to the tuning port of VCO 206, via loop filter 204. With the loop opened, the output frequency of VCO 206 is then measured when applying both high and low inputs, or codes, to DAC 228. The gain $K_{HPA}$ for the analog portion of the high-pass path (from the DAC through the modulation port of the VCO), in units of hertz per least significant bit (LSB) of the input DAC code, can be written as:

$$K_{HPA}(Hz/LSB) = \frac{f_1 - f_2}{Code_{DAC1} - Code_{DAC2}}.$$

Frequencies $f_1$ and $f_2$ are measured using ripple counter 312. Calibration engine 302 determines, from the estimate of $K_{HPA}$, how much the gain of the high pass path needs to be adjusted to obtain an acceptable frequency response, and makes appropriate adjustments to the gain of the high-pass path, typically by adjustment of variable high-pass path amplifier 306. The PLL is then closed again using switch 308 in preparation for transmission. In an embodiment, this calibration is repeated before transmission of each packet of data.

A problem with the open-loop calibration procedure described above can arise with the time required for measurement of frequencies $f_1$ and $f_2$ using ripple counter 312. Because the ripple counter is counting waveforms of the output signal from the VCO, it counts over a period of time, dividing the waveform count by the time period to obtain the frequency. Greater accuracy of the frequency measurement therefore requires greater counting times. In some embodiments the output of the VCO is frequency-divided before reaching the ripple counter, in order to lower power requirements, which causes the counting time to be even longer. For radios operating in a 2.4 GHz band, a requirement of 1% peak frequency deviation can lead to a calibration time of over 1 millisecond. In certain existing wireless networking technologies, this time is far too long for implementation of calibration before sending each packet. As an example, the Bluetooth Low Energy (BLE) technology, which requires 1% peak frequency deviation in some modes, has a receive-to-transmit turnaround time of 150 microseconds.

Various modifications can be made during the open-loop calibration process to shorten the frequency measurement time. One of these modifications is to increase the gain associated with the modulation port of the VCO, by increasing the size of the variable capacitance (or more generally, variable reactance) associated with the $V_{mod}$ input. In terms of the VCO circuit of FIG. 1, for example, this modification would require increasing, during the open-loop calibration procedure, the size of the $C_{VARm}$ variable capacitors 134. This can be done by adding a switched bank of additional varactor cells in parallel with input circuit 108 of FIG. 1, so that additional varactor cells can be connected during the open-loop calibration process and then disconnected during closed-loop operation. The increased gain increases the VCO output frequencies obtained during the open-loop calibration, which shortens the time needed to measure those frequencies to a given degree of accuracy.

A significant drawback of increasing the modulation port gain by adding additional varactors during calibration is that this creates an overall shift in the average output frequency of the VCO during the calibration, because of the extra capacitance connected to the tank circuit. This shift in turn causes a shift in the VCO modulation port gain, because the VCO modulation port gain has a cubic dependence on frequency:

$$K_{mod}(f) = K_{mod}(f_0) \cdot \left(\frac{f}{f_0}\right)^3.$$

As a result of this frequency shift, an increase in modulation port gain in order to obtain a faster calibration can result in a less accurate calibration, since the estimate of the high-pass path gain is performed at a different average frequency if the modulation port gain is increased than if it is not. Given that some operating modes require no more than 1% peak frequency deviation, this frequency shift during calibration can produce a variation in the frequency response of the synthesizer sufficient to cause unacceptable distortion. Attempting to predict and compensate for this frequency shift generally requires complex digital hardware which can introduce its own sources of inaccuracy. The complication of accounting for the frequency shift has limited the degree to which increasing the modulation gain can be used to lower calibration times.

Figure 4:
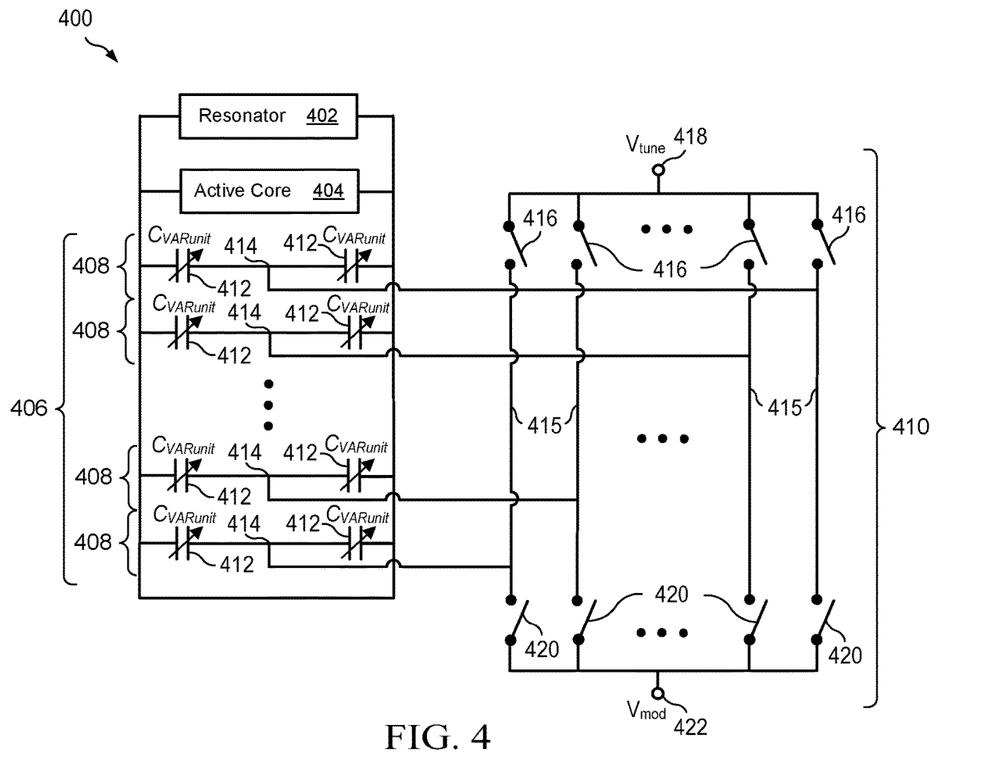
FIG. 4 is a high-level schematic diagram illustrating a tunable oscillator including a variable reactance apparatus according to one embodiment of the present disclosure.

The variable reactance apparatus described in this disclosure makes it possible for the gain associated with one input of a tunable oscillator to be altered while keeping the average output frequency of the oscillator unchanged. A high-level schematic diagram illustrating a tunable oscillator including such a variable reactance apparatus is shown in FIG. 4. Oscillator 400 includes a resonator 402, active core 404, variable reactance bank 406, and control circuit 410. In an embodiment, resonator 402 is in the form of an LC tank circuit, like resonator 102 of FIG. 1. In alternative embodiments, resonator 402 can take other forms, such as an RC network or any other resonator circuit compatible with the use of variable reactance elements for tuning. Active core 404 is a circuit providing a negative impedance to the resonator so that oscillations are sustained. In an embodiment, active core 404 includes one or more cross-coupled transistor pairs, such as that of active core 104 in FIG. 1. In alternative embodiments, active core 404 can take other forms, such as a Colpitts circuit, a Hartley circuit, or any other active core compatible with the use of variable reactance elements for oscillator tuning.

Variable reactance bank 406 is connected across resonator 402 and active core 404, and includes a bank of multiple unit variable reactance structures 408 connected in parallel. In the embodiment of FIG. 4, each unit variable reactance structure 408 includes a pair of variable capacitors 412 labeled $C_{VARunit}$, with a control input node 414 between the variable capacitors 412. In this embodiment, variable unit reactance structures 408 are direct-current (DC) coupled. In other embodiments, structures such as structures 408 are AC coupled and include coupling capacitors and bias signal inputs similar to those in input circuits 106 and 108 of FIG. 1. A "unit" structure as used herein refers to one of the repeated structures within a bank of unit variable reactance structures. Each unit structure has component values nominally identical to those of corresponding components in each of the other unit structures, though some variation due to processing tolerances may occur.

In the embodiment of FIG. 4, control circuit 410 connects control input node 414 of each unit structure 408 to a respective conductor 415, where conductor 415 is effectively an elongated terminal that can be connected to one or the other of a tuning signal 418, labeled $V_{tune}$ in this embodiment, or a tuning signal 422 labeled $V_{mod}$. Each of switches 416 can be actuated to connect one of control input nodes 414 to tuning signal 418, while each of switches 420 can be actuated to connect one of control input nodes 414 to tuning signal 422. In an embodiment, the switches are actuated via respective selection signals (not shown). Variable reactance bank 406 and control circuit 410 combine to form an embodiment of a variable reactance apparatus for a two-input tunable oscillator (a VCO, in the embodiment of FIG. 4). This variable reactance apparatus can be used in place of input circuits such as circuits 106 and 108 in the VCO of FIG. 1.

To change the gain associated with one of the tuning signals of oscillator 400 while minimizing any change in the oscillator's average frequency, switches 416 and 420 are controlled to change the number of unit variable reactance structures 408 connected to their corresponding tuning signals, while the total number of structures 408 connected to one or the other of the tuning signals remains constant. The midrange values of the tuning signals are kept as close as possible to one another. For example, to use oscillator 400 in the frequency synthesizer embodiment of FIG. 3, the reference voltage 310 used for tuning voltage $V_{tune}$ during open-loop calibration is set to the midpoint voltage of DAC 228 (the midrange value of tuning voltage $V_{mod}$) in one embodiment.

If the midrange values for tuning signals 418 and 422 are the same, and assuming any variations in the tuning signals are symmetric about the midrange value, then an equal average capacitance is contributed by each variable reactance structure 408, regardless of which tuning signal is applied to a given structure. For example, if bank 406 includes n variable capacitance structures 408, and if the same voltage $V=V_{mod}=V_{tune}$ is applied as tuning signals 418 and 422, the capacitance of bank 406 is equal to n times the capacitance of one unit variable capacitance structure:

$$C_{bank}=n \times C_{VARunit}(V).$$

The total capacitance of bank 406 stays constant in this embodiment as long as each of the variable capacitance structures is connected to one or the other of tuning signals 418 and 422. In a first mode of operation, for example, a number x of the n variable capacitance structures is connected to input signal 422 labeled $V_{mod}$. In this mode the remaining n−x structures would be connected to input signal 418 labeled $V_{tune}$. In a second mode of operation, a different number y of the n variable capacitance structures could be connected to input signal 422, and the remaining n−y structures connected to input signal 418. Changing from the first to the second mode of operation would not change the operating frequency of oscillator 400.

An illustration of tuning signal connections for a set of operating modes implemented using a tunable oscillator such as that of FIG. 4 is shown in Table 1 below. In the embodiment of Table 1, the variable reactance apparatus includes a bank of twelve unit variable reactance structures. In operating mode 1 of Table 1, unit variable reactance structures 1 and 2 are connected to tuning signal 1, while the remaining structures are connected to tuning signal 2. In operating mode 2, unit variable reactance structures 1 through 4 are connected to tuning signal 1, with the rest connected to tuning signal 2. In operating mode 3, unit variable reactance structures 1 through 8 are connected to tuning signal 1, with the rest connected to tuning signal 2.

TABLE 1

| Mode | Unit Variable Reactance Structure # | | | | | | | | | | | |
|---|---|---|---|---|---|---|---|---|---|---|---|---|
| # | 1 | 2 | 3 | 4 | 5 | 6 | 7 | 8 | 9 | 10 | 11 | 12 |
| 1 | Sig. 1 | Sig. 1 | Sig. 2 | Sig. 2 | Sig. 2 | Sig. 2 | Sig. 2 | Sig. 2 | Sig. 2 | Sig. 2 | Sig. 2 | Sig. 2 |
| 2 | Sig. 1 | Sig. 1 | Sig. 1 | Sig. 1 | Sig. 2 | Sig. 2 | Sig. 2 | Sig. 2 | Sig. 2 | Sig. 2 | Sig. 2 | Sig. 2 |
| 3 | Sig. 1 | Sig. 1 | Sig. 1 | Sig. 1 | Sig. 1 | Sig. 1 | Sig. 1 | Sig. 1 | Sig. 2 | Sig. 2 | Sig. 2 | Sig. 2 |

In an embodiment for which tuning signal 1 is supplied via a high-pass path in a frequency synthesizer such as that of FIG. 3, and tuning signal 2 is supplied via the low-pass path of such a synthesizer, mode 1 of Table 1 could correspond to a transmission mode for the frequency synthesizer, while modes 2 and 3 could correspond to open-loop calibration modes. In such an embodiment, oscillator 400 would be used in place of VCO 206 in FIG. 3. The increased number of unit variable reactance structures connected to the high-pass path during open-loop calibration modes such as modes 2 and 3 provides an increase in the gain of the high-pass path and a corresponding decrease in the time needed for the frequency measurements made as part of the calibration process.

In the embodiment of FIG. 4, control circuit 410 is configured to connect control input node 414 of each unit variable reactance structure 408 to one or the other of tuning signals 418 or 422. Another embodiment of a control circuit for a variable reactance apparatus, shown in FIG. 5, allows a third connection option. Variable reactance apparatus 500 of FIG. 5 includes a variable reactance bank 502 and control circuit 504. Variable reactance bank 502 is configured for connection, at the top end of the drawing, across a circuit being tuned using variable reactance apparatus 500. In an embodiment, the circuit being tuned is a tunable oscillator circuit.

Figure 5:
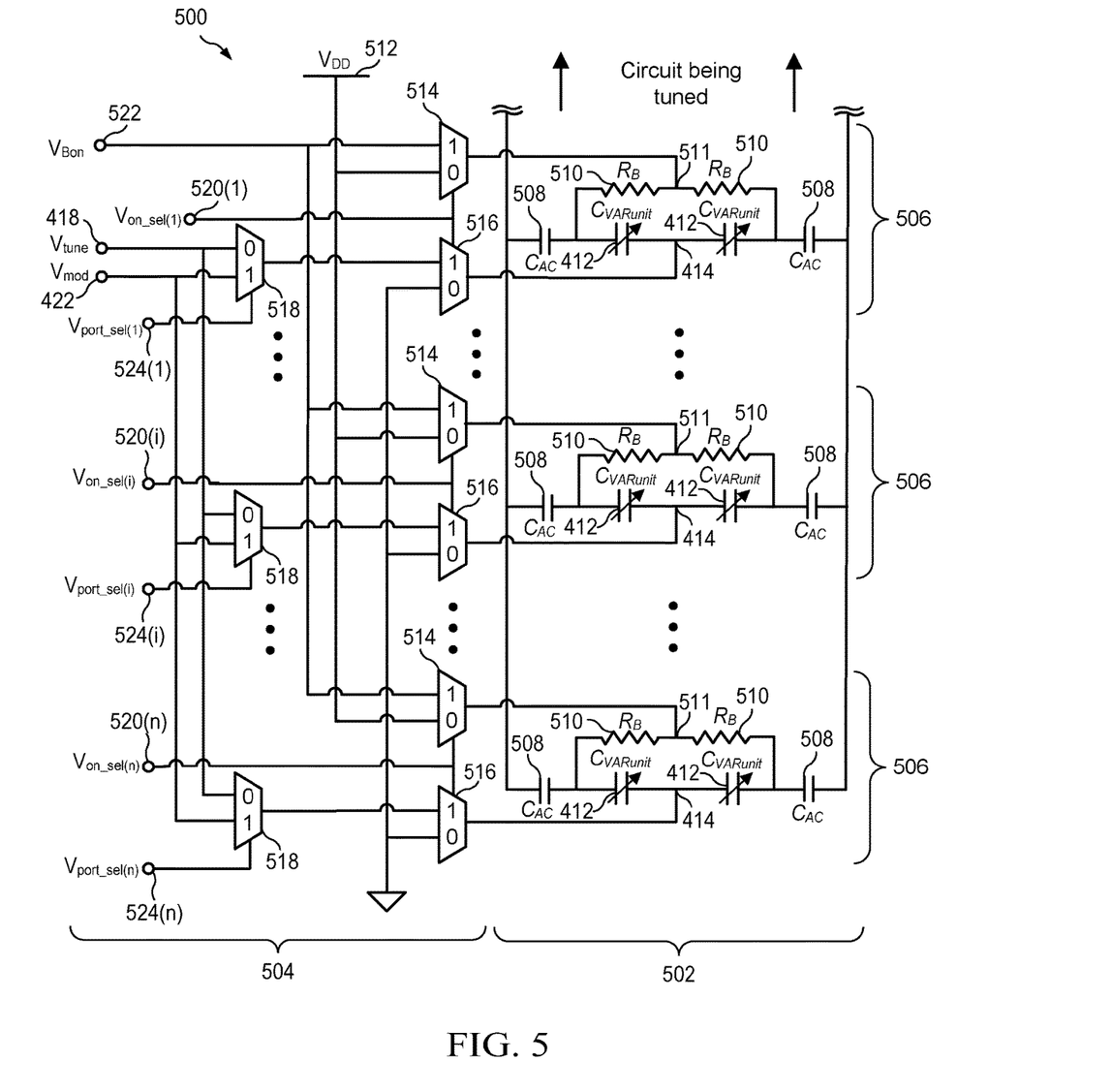
FIG. 5 is a schematic diagram illustrating a variable reactance apparatus according to one embodiment of the present disclosure.

Variable reactance bank 502 includes multiple unit variable reactance structures 506 connected in parallel. In the embodiment of FIG. 5, unit variable reactance structures 506 are AC-coupled, so that in addition to unit variable capacitors 412 labeled $C_{VARunit}$ each of structures 506 includes AC coupling capacitors 508, bias resistors 510 and a bias signal node 511 between the bias resistors. Coupling capacitors 508 are similar to coupling capacitors 118 in the oscillator of FIG. 1. Bias resistors 510 are similar to bias resistors 124 and 132 in the oscillator of FIG. 1, with the difference that resistors 124 may be specified to have different values than resistors 132 in oscillator 100, while resistors 510 are specified as having the same values in each of unit structures 506.

In the embodiment of FIG. 5, control circuit 504 connects control input node 414 of each unit structure 506 to the output of a respective control multiplexer 516. Each of multiplexers 516 provides one of its two input signals to its output, depending on the value ("0" or "1") of a select signal. The select signal value is specific to each unit variable reactance structure, as indicated by use of reference number 520(1) or label $V_{on\_sel(1)}$ for the select signal to multiplexer 516 of the first unit variable reactance structure at the top of bank 502, reference number 520(i) or label $V_{on\_sel(i)}$ for the select signal to multiplexer 516 of the ith unit variable reactance structure shown at the center of bank 502, and reference number 520(n) or label $V_{on\_sel(n)}$ for the select signal to multiplexer 516 of the nth unit variable reactance structure at the bottom of bank 502. The value of the $V_{on\_sel}$ signal determines whether the corresponding unit variable reactance structure is to be utilized (i.e., turned "on") in a particular tuning application of the variable reactance apparatus 500. A "1" value of $V_{on\_sel}$ causes the output of signal multiplexer 518 to be connected to control input node 414 of the corresponding unit variable reactance structure, where the output of signal multiplexer 518 is one of tuning signals 418 or 422 (described in connection with FIG. 4 above). A "0" value of $V_{on\_sel}$ causes an off-state control signal, set to circuit ground in the embodiment of FIG. 5, to be connected to control input node 414.

In addition to its use with control multiplexers 516 discussed above, select signal $V_{on\_sel}$ is provided to bias multiplexer 514 of the corresponding unit variable reactance structure. For a given unit variable reactance structure, select signal $V_{on\_sel}$ therefore determines whether the structure is on or off by selecting between (1) an on-state or off-state control signal for application to control input node 414 via control multiplexer 516, and (2) an on-state or off-state bias signal for application to bias signal node 511 via bias multiplexer 514. In the embodiment of FIG. 5, the on-state bias signal 522 with label $V_{Bon}$ is used for each of the unit variable reactance structures, while supply voltage 512 ($V_{DD}$) is used for the off-state bias signal. If the variable capacitors 412 are implemented using accumulation metal-oxide-semiconductor (MOS) technology, on-state bias signal 522 is in some embodiments set to be close to the control signal value. This may result in a relatively high varactor gain value and relatively linear varactor response. In embodiments using a different variable reactance implementation technology, a different bias signal setting may be used.

A separate select signal 524 with label $V_{port\_sel}$ is provided to signal multiplexer 518 to determine which of the two input tuning signals is provided to control multiplexer 516 as the on-state control signal for the corresponding unit variable reactance structure. In an embodiment, select signal $V_{port\_sel}$ determines which input, or port, of a tunable oscillator the corresponding unit variable reactance structure is connected to. As in the case of select signal $V_{on\_sel}$ discussed above, the value of $V_{port\_sel}$ is specific to each unit variable reactance structure, as indicated by the use of reference number 524(1) or label $V_{port\_sel(1)}$ for the select signal to multiplexer 518 of the first unit variable reactance structure at the top of bank 502, reference number 524(i) or label $V_{port\_sel(1)}$ for the select signal to multiplexer 518 of the ith unit variable reactance structure shown at the center of bank 502, and reference number 524(n) or label $V_{port\_sel(n)}$ for the select signal to multiplexer 518 of the nth unit variable reactance structure at the bottom of bank 502.

Multiple alternatives and variations to variable reactance apparatus 500 will be apparent to one of ordinary skill in the art in view of this disclosure. For example, the combination of signal multiplexer 518 and control multiplexer 516 can in some embodiments be implemented as a single larger multiplexer with two select signals. The use of ground potential for the off-state control signal and supply voltage $V_{DD}$ for the off-state bias signal in apparatus 500 may advantageously provide a minimal off-state capacitance value for a variable capacitor implemented with accumulation MOS technology. Different off-state control and bias signals may be appropriate when different variable reactance implementation technologies are used.

Figure 6:
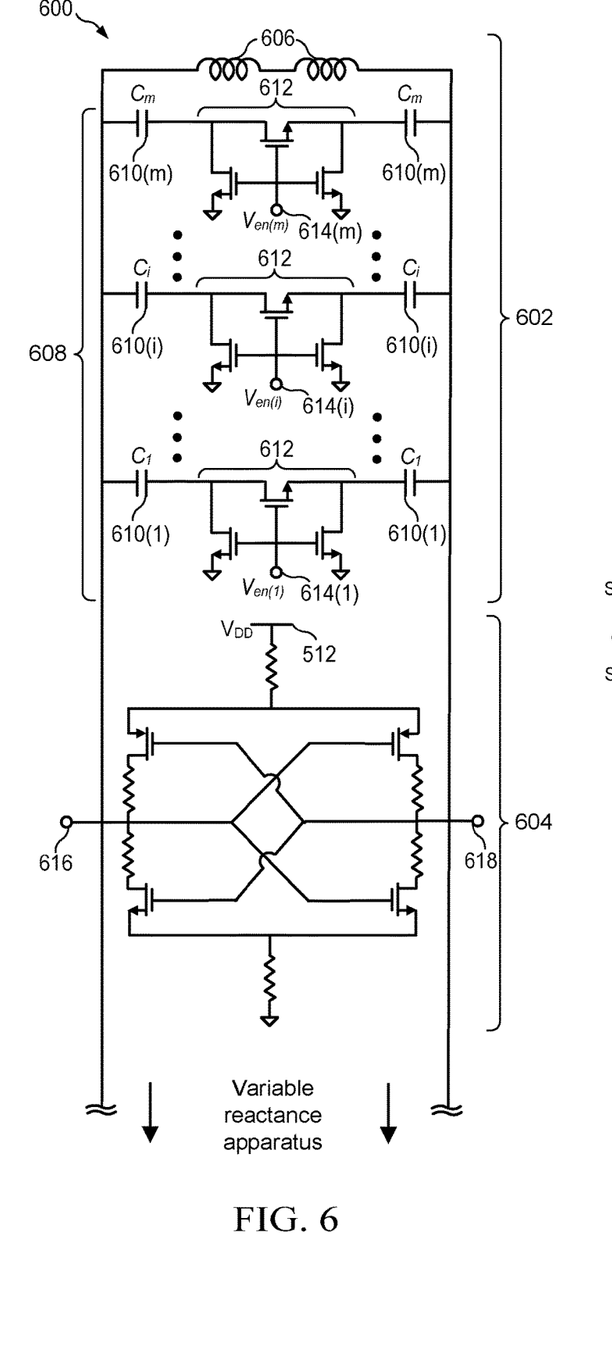
FIG. 6 is a schematic diagram illustrating tunable oscillator components for use with the variable reactance apparatus of FIG. 5, according to one embodiment of the present disclosure.

An embodiment of a circuit that can be connected across variable reactance bank 502 of FIG. 5 is shown in FIG. 6. The interrupted conductors at the bottom of VCO assembly 600 can be connected to the interrupted conductors at the top of variable reactance apparatus 500 of FIG. 5. Assembly 600 includes a resonator 602 and an active core 604. In the embodiment of FIG. 6, resonator 602 is implemented as an LC tank circuit including a pair of inductors 606 and a course-tuning capacitor bank 608. Capacitor bank 608 includes an integer number m of capacitor elements, where each element includes a pair of capacitors 610 and a switching element 612. Switching elements 612 are implemented in this embodiment by networks of NMOS transistors. Each capacitor element within bank 608 is selectively activated or deactivated using an enable voltage 614. In an embodiment in which VCO assembly 600 is used in a frequency synthesizer circuit such as synthesizer 300 of FIG. 3, enable voltage 614 for each capacitor element within coarse-tuning bank 608 can be supplied using selector 224 and/or calibration engine 302 of FIG. 3, as illustrated by the dashed line from adder 314 to VCO 206. In some embodiments of capacitor bank 608, each element uses the same values of capacitors 610. In other embodiments, different elements have different capacitor values, such as a binary coded approach in which a capacitor value of each successive element is twice the value of the preceding element. When VCO assembly 600 is connected to variable reactance apparatus 500 of FIG. 5, coarse-tuning capacitor bank 608 combines with variable capacitance bank 502 to form the capacitance of the tank circuit formed with inductors 606. In the embodiment of FIG. 6, active core 604 is implemented in a cross-coupled complementary MOS (CMOS) configuration. The output voltage of the VCO appears across the active core and the tank circuit, or between terminals 616 and 618 in the embodiment of FIG. 6.

Returning to the variable reactance apparatus of FIG. 5, the ability provided by control circuit 504 to control whether each of unit variable reactance structures 506 is turned on or off allows additional transmission and calibration modes to be implemented when apparatus 500 is used in a frequency synthesizer such as that of FIG. 3. An illustration is shown in Table 2 below of signal connections for operating modes implemented using a tunable oscillator such as that resulting from a combination of FIGS. 5 and 6.

Like Table 1 above, Table 2 illustrates a bank of twelve unit variable reactance structures. The first three operating modes shown in Table 2 are the same as the modes shown in Table 1. In operating mode 4 of Table 2, unit variable reactance structures 1 and 2 are connected to tuning signal 1, unit variable reactance structures 3 through 10 are connected to tuning signal 2, and the remaining structures are connected to the off-state control signal (ground potential, in the embodiment of FIG. 5). In operating mode 5, unit variable reactance structures 1 through 4 are connected to tuning signal 1, structures 5 through 10 are connected to tuning signal 2, and the remaining structures are connected to the off-state control signal. In operating mode 6, unit variable reactance structures 1 through 8 are connected to tuning signal 1, structures 9 and 10 are connected to tuning signal 2, and the rest are connected to the off-state control signal.

In an embodiment for which tuning signal 1 is supplied via the high-pass path in a frequency synthesizer such as that of FIG. 3, and tuning signal 2 is supplied via the low-pass path of such a synthesizer, modes 1 and 4 of Table 2 could correspond to transmission modes for the frequency synthesizer. These two transmission modes correspond to different levels of overall VCO gain, where the overall gain is related to the combined capacitance of the unit variable reactance structures connected to either of the tuning signals for the VCO (in addition to any coarse-tuning capacitance or other capacitance outside of capacitor bank 502). The two transmission modes could employ different modulation schemes, different transmission frequencies, and/or different reference oscillator frequencies within the frequency synthesizer.

Operating modes 2 and 3 of Table 2 represent possible calibration modes for transmission using mode 1, in an embodiment using a tunable oscillator including the variable reactance apparatus in a frequency synthesizer such as that of FIG. 3. Similarly, operating modes 5 and 6 of Table 2 represent possible calibration modes for transmission using mode 4. To minimize any VCO frequency shift when switching from a calibration mode to a transmission mode or vice versa, the total number of unit variable capacitance structures connected to one of the tuning signals is kept constant. Mode 5 therefore represents a suitable calibration mode for transmission using mode 4, but not for transmission using mode 1. Although the "off" structures in modes 4, 5 and 6 of Table 2 are shown as being structures 11 and 12, "off" structures can be positioned at any point along a bank of unit variable reactance structures. In some embodiments, one mode within a single set of modes including a transmission mode and associated calibration modes (such as modes 4-6 of Table 2) has different structures turned off than are turned off in another mode within the same set, though the number of structures turned off is the same for each node within the set.

TABLE 2

| Mode # | Unit Variable Reactance Structure # | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| 1 | Sig. 1 | Sig. 1 | Sig. 2 | Sig. 2 | Sig. 2 | Sig. 2 | Sig. 2 | Sig. 2 | Sig. 2 | Sig. 2 | Sig. 2 | Sig. 2 |
| 2 | Sig. 1 | Sig. 1 | Sig. 1 | Sig. 1 | Sig. 2 | Sig. 2 | Sig. 2 | Sig. 2 | Sig. 2 | Sig. 2 | Sig. 2 | Sig. 2 |
| 3 | Sig. 1 | Sig. 1 | Sig. 1 | Sig. 1 | Sig. 1 | Sig. 1 | Sig. 1 | Sig. 1 | Sig. 2 | Sig. 2 | Sig. 2 | Sig. 2 |
| 4 | Sig. 1 | Sig. 1 | Sig. 2 | Sig. 2 | Sig. 2 | Sig. 2 | Sig. 2 | Sig. 2 | Sig. 2 | Sig. 2 | Off | Off |
| 5 | Sig. 1 | Sig. 1 | Sig. 1 | Sig. 1 | Sig. 2 | Sig. 2 | Sig. 2 | Sig. 2 | Sig. 2 | Sig. 2 | Off | Off |
| 6 | Sig. 1 | Sig. 1 | Sig. 1 | Sig. 1 | Sig. 1 | Sig. 1 | Sig. 1 | Sig. 1 | Sig. 2 | Sig. 2 | Off | Off |

Figure 7:
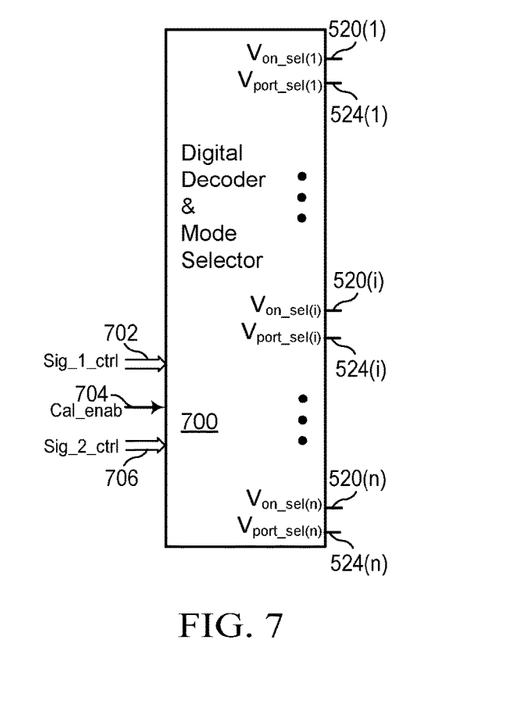
FIG. 7 is a block diagram illustrating a decoder and mode selector for use with the variable reactance apparatus of FIG. 5, according to one embodiment of the present disclosure.

In an embodiment, a control circuit within a variable reactance apparatus as described herein includes a digital decoder and mode selector for generating select signals associated with each unit variable reactance structure, such as select signals $V_{on\_sel}$ and $V_{port\_sel}$ of FIG. 5. An example of such a decoder and mode selector is illustrated in FIG. 7. In the embodiment of FIG. 7, decoder 700 has three control inputs: tuning signal 1 control 702, calibration mode enable 704 and tuning signal 2 control 706. Tuning signal 1 control 702 indicates the number of unit variable reactance structures that are to be connected to tuning signal 1 for the current operating mode. Tuning signal 2 control 706 indicates the maximum number of unit variable reactance structures that are to be connected to tuning signal 2 for the current set of operating modes (such as a transmission mode and its associated calibration modes). In another embodiment, tuning signal 2 control 706 can be used as an indicator of the number of unit variable reactance structures to be turned on (or alternatively, turned off) for the current set of operating modes. In a still further embodiment, tuning signal 2 control 706 can reflect another quantity, such as a reference oscillator frequency, that in turn relates to the number of unit variable reactance structures turned on (or off). In some embodiments, one or both of control signals 702 and 706 is provided via a bus.

Calibration mode enable 704 indicates whether the current operating mode is a calibration mode, for an embodiment in which the variable reactance apparatus is part of a VCO used in a dual port frequency synthesizer circuit such as that of FIG. 3. In such an embodiment, control signals 702, 704 and 706 are generated by a controller for the frequency synthesizer, such as calibration engine 302 of FIG. 3. Decoder and mode selector 700 has other inputs not shown in FIG. 7 but generally applicable to digital circuits, such as power supply inputs, as will be apparent to one of ordinary skill in the art of digital circuit design in view of this disclosure.

Figure 8:
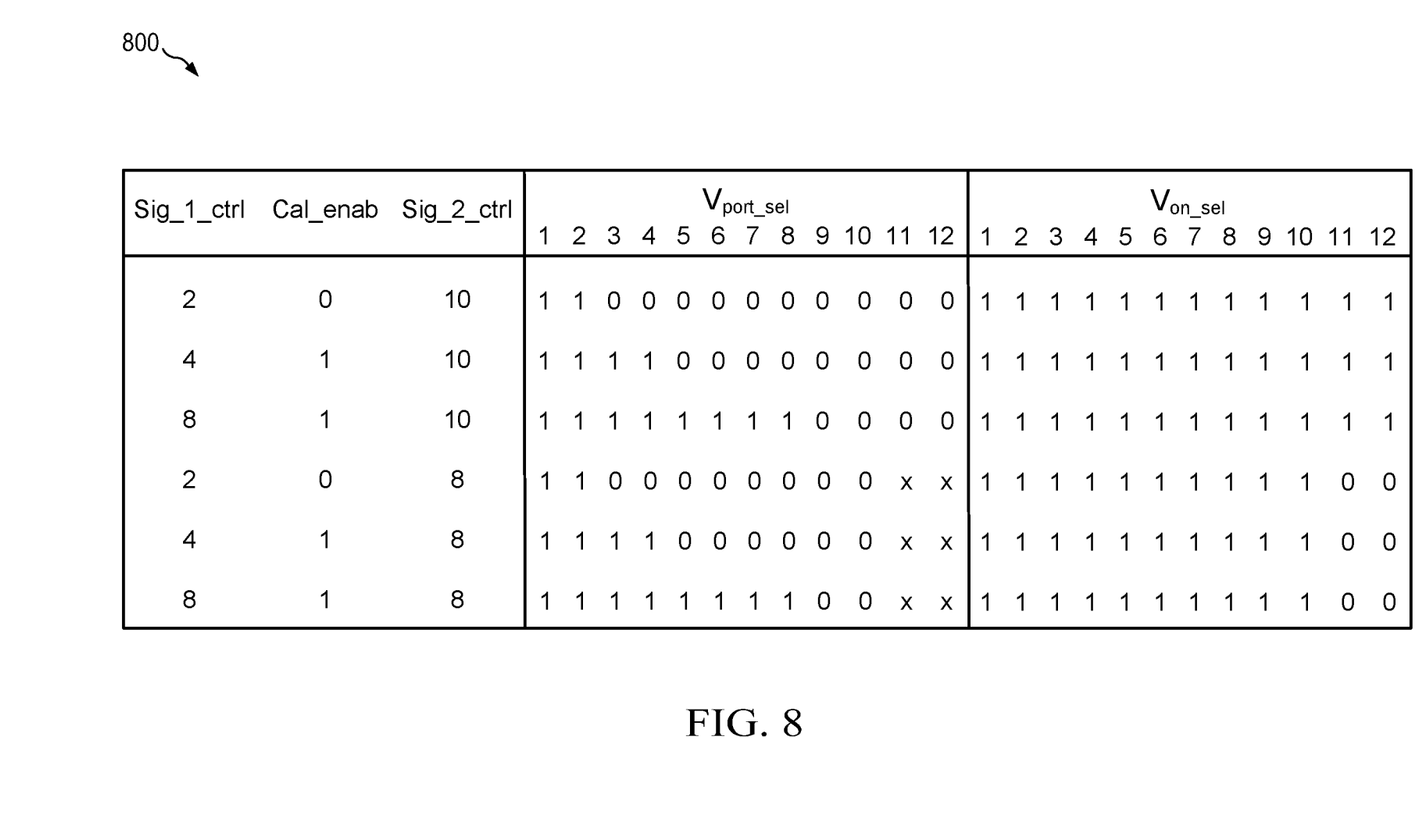
FIG. 8 is a portion of a truth table implemented by the decoder and mode selector of FIG. 7, according to one embodiment of the present disclosure.

Outputs from decoder and mode selector 700 include two selection signals for each unit variable reactance structure in the variable reactance apparatus. In the embodiment of FIG. 700, the outputs correspond to the selection signals for the multiplexers in control circuit 504 of FIG. 5. A portion 800 of a truth table relating inputs of decoder 700 to outputs is shown in FIG. 8. Truth table portion 800 does not include every possible combination of control inputs Sig_1ctrl, Cal_enab and Sig_2_ctrl; it includes the combinations corresponding to the operating modes shown in Table 2 above. In an embodiment, combinatorial logic within decoder 700 implements the relationships in a truth table including portion 800.

In the embodiment of FIG. 8, the value of Sig_1_ctrl corresponds to the number of unit variable reactance structures connected to tuning signal 1. A "1" value of Cal_enab corresponds to a calibration mode of a frequency synthesizer employing a VCO with the variable reactance apparatus, while a "0" value of Cal_enab corresponds to a transmission mode. The value of Sig_2_ctrl corresponds to the maximum number of variable unit reactance structures connected to tuning signal 2 in this embodiment. In keeping with the example of Table 2 above, table portion 800 includes $V_{port\_sel}$ and $V_{on\_sel}$ outputs for each of a bank of twelve unit variable reactance structures. A "1" value of $V_{port\_sel}$ corresponds to tuning signal 1 of Table 2, while a "0" value corresponds to tuning signal 2. The "x" values of $V_{port\_sel}$ for structures 11 and 12 in the lower rows of the table indicate that those structures are in an off state, as indicated by "0" values of $V_{on\_sel}$, so that the value of $V_{port\_sel}$ doesn't matter.

A "1" value of $V_{on\_sel}$ indicates that the corresponding unit variable reactance structure is in an "on" state, so that the tuning signal indicated by the corresponding $V_{port\_sel}$ value is connected to the control input of the structure. The control signals of FIGS. 7 and 8 represent one example of a control signal configuration for defining modes of a tunable oscillator; other control signal configurations are possible, as will be recognized by one of ordinary skill in the art of tunable oscillator design in view of this disclosure.

Figure 9:
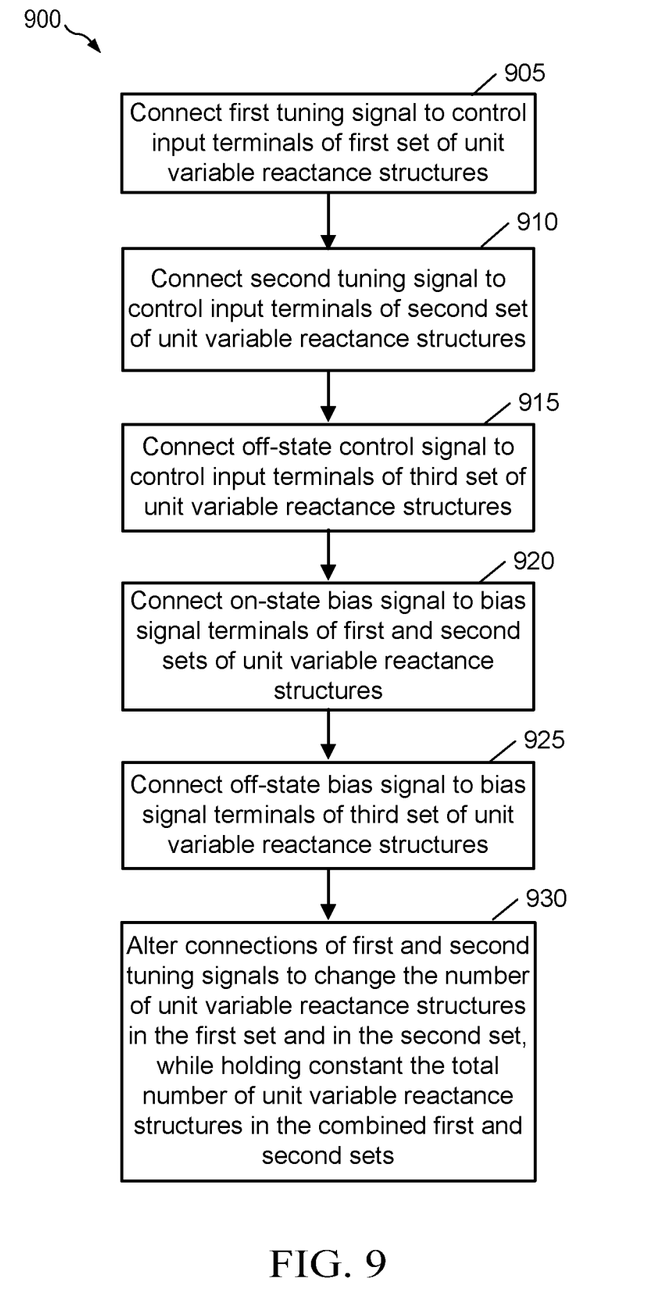
FIG. 9 is a flowchart illustrating a method for changing a gain associated with an input signal of a tunable oscillator.

A flow diagram illustrating a method of changing a gain associated with an input of a tunable oscillator including a bank of unit variable reactance structures is shown in FIG. 9. In an embodiment, method 900 is performed through operation of a control circuit such as circuit 504 of FIG. 5. In a further embodiment, method 900 is performed through operation of a decoder, such as decoder 700 of FIG. 7, within a control circuit. Although steps of method 900 are shown in sequential order, certain steps may be performed in a different order, or simultaneously, in other embodiments of the method. Method 900 begins in step 905 with connecting a first tuning signal to control input terminals of a first set of unit variable reactance structures. In an embodiment, the first tuning signal is a signal supplied via one of two input paths in a dual port frequency synthesizer, such as $V_{mod}$ signal 422 of FIGS. 4 and 5.

Method 900 further includes, in step 910, connecting a second tuning signal to control input terminals of a second set of unit variable reactance structures. In a dual port frequency synthesizer embodiment as described above, $V_{tune}$ signal 418 in FIGS. 4 and 5 is an example of a second tuning signal. The first and second tuning signals can be selectively connected to control input terminals of respective first and second sets of unit variable reactance structures through, for example, a switch array such as that of FIG. 4 or a multiplexer arrangement such as that of FIG. 5. "Set" is used herein in the mathematical sense, so that a set of unit variable reactance structures may in some embodiments include only a single unit variable reactance structure. Although shown sequentially in FIG. 9, steps 905 and 910 may be performed in reverse order or simultaneously in other embodiments.

Method 900 further includes, in step 915, connecting an off-state control signal to control input terminals of a third set of variable reactance structures. For control circuit embodiments lacking an off-state connection option, such as circuit 410 of FIG. 4, step 915 would not be included in a method similar to method 900. An example of an off-state control signal is the ground potential supplied to multiplexers 516 in FIG. 5. An example of a third set of unit variable reactance structures connected to an off-state control signal is the set of structures 11 and 12 in operating modes 4, 5 and 6 of the example of Table 2 above. Although shown sequentially in FIG. 9, in other embodiments steps 905, 910 and 915 may be performed in a different order, or one or more of the steps may be performed simultaneously.

Step 920 of method 900 involves connecting an on-state bias signal to bias signal terminals of structures within the first and second sets of unit variable reactance structures. An example of an on-state bias signal is signal 522 labeled $V_{Bon}$ in FIG. 5. For variable reactance bank embodiments not employing AC coupling and individual bias circuits like those shown in bank 502 of FIG. 5, step 920 would not be included in a method similar to method 900. Method 900 further includes, at step 925, connecting an off-state bias signal to bias signal terminals of the third set of unit variable reactance structures. Because step 925 involves the off-state connection option described above in connection with step 915, an embodiment not including step 915 would similarly not include step 925. An example of an off-state bias signal is the supply signal 512 supplied to multiplexers 514 in the embodiment of FIG. 5. Although shown sequentially in FIG. 9, in other embodiments steps 905, 910, 915, 920 and 925 may be performed in a different order, or one or more of the steps may be performed simultaneously.

Method 900 ends in step 930 with altering connections of the first and second tuning signals to change the numbers of unit variable reactance structures in the first set and the second set of unit variable reactance structures, while holding constant the total number of unit variable reactance structures in the combined first and second sets of unit variable reactance structures. As one example, altering connections of the first and second tuning signals occurs if an operating mode of a tunable oscillator including a variable reactance apparatus is changed from mode 1 to mode 2 of Table 2. In this example, the change from mode 1 to mode 2 would alter the connections of tuning signal 1 from connection to structures 1 and 2 to connection to structures 1 through 4. The connections of tuning signal 2 would be altered from connection to structures 3 through 12 to connection to structures 5 through 12. In each of modes 1 and 2, the total number of unit variable reactance structures in the combined first and second sets, or the total number of structures connected to either tuning signal 1 or tuning signal 2, is twelve. A change in operating mode from mode 1 to mode 2 therefore holds constant the number of unit variable reactance structures in the combined first and second sets.

In an embodiment of a control circuit including a decoder such as decoder 700 of FIG. 7, a change from mode 1 to mode 2 of Table 2 can be implemented by a change to control signals 702, 704 and/or 706 of FIG. 7. As shown in the truth table of FIG. 8, for example, a change of the Sig_1_ctrl signal value from "2" to "4" and the Cal_enab signal value from 0 to 1 would change the $V_{port\_sel}$ multiplexer selection signals such that the tuning signal connections would change from those of mode 1 in Table 2 to those of mode 2. Another example of altering connections as described in step 930 of method 900 would be a change between modes 4, 5, and 6 of Table 2. In an embodiment using a tunable oscillator including the variable reactance apparatus in a frequency synthesizer such as that of FIG. 3, modes within the same set of modes (e.g., a transmission mode and its associated calibration modes) are set up so that the total number of unit variable reactance structures that are active (turned on) and connected to one of the signal inputs is the same for each mode within the set.

Multiple alternatives and variations to the embodiments described herein will be apparent to one of ordinary skill in the art of tunable oscillator design in view of this disclosure. For example, embodiments presented herein employ a variable capacitance in the unit variable reactance structure, but a variable inductance or a reactance formed from a combination of capacitance and inductance can be used in other embodiments. A tunable oscillator employing a variable reactance apparatus as described herein may include a voltage controlled oscillator or a current controlled oscillator. As noted above in connection with the tunable oscillator embodiment of FIG. 4, such a tunable oscillator can be based on various technologies including an LC tank circuit, an RC network or a ring oscillator. An active core of a tunable oscillator employing a variable reactance apparatus as described herein may include cross-coupled pairs of various types of transistors, including NMOS only, PMOS only, CMOS or bipolar transistors. Other types of active core such as Colpitts or Hartley circuits may also be used in some embodiments. Although tunable oscillators having two tuning signal inputs (aside from a possible coarse-tuning input) are described herein, the disclosed variable reactance apparatus may also be used to implement a tunable oscillator having three or more tuning signal inputs, in conjunction with a suitable control circuit allowing allocation of the unit variable reactance structures among the inputs. The unit variable reactance structures described herein employ single variable capacitor pairs, but more elaborate variable reactance structures can be used in other embodiments, such as groups of multiple AC-coupled varactors having different biasing voltages. Such a multiple-varactor embodiment may have an improved linearity in its response to a tuning voltage.

As described above, a variable reactance apparatus disclosed herein allows a gain associated with one tuning input among multiple tuning inputs of a tunable oscillator to be changed while minimizing any change in operating frequency of the tunable oscillator. An embodiment of the variable reactance apparatus includes a plurality of unit variable reactance structures connected in parallel, where each of the plurality of unit variable reactance structures includes a respective one of a plurality of control input nodes. This embodiment of the apparatus also includes a control circuit operably coupled to the plurality of unit variable reactance structures and configured to selectively connect, based on one or more selection signals, each of the plurality of control input nodes to a respective signal from among a plurality of signals, where the plurality of signals comprises a first tuning signal and a second tuning signal. In a further embodiment, the plurality of signals also includes an off-state control signal. In another embodiment, each of the unit variable reactance structures comprises a variable capacitor structure.

In another embodiment of the apparatus, each unit variable reactance structure within the plurality of unit variable reactance structures includes a respective one of a plurality of pairs of AC coupling capacitors and respective one of a plurality of bias signal nodes. In this embodiment the control circuit is further configured to connect an on-state bias signal to each bias signal node within a unit variable reactance structure having its respective control input node connected to the first tuning signal or the second tuning signal. In a further embodiment, the plurality of signals also includes an off-state control signal, and the control circuit is further configured to connect an off-state bias signal to each bias signal node within a unit variable reactance structure having its respective control input node connected to the off-state control signal.

In still another embodiment of the apparatus, the control circuit comprises a plurality of multiplexers, and each of the plurality of multiplexers comprises one or more multiplexer select inputs connected to respective signals from among the one or more selection signals. In another embodiment, the control circuit is further configured to selectively reconnect, based on the one or more selection signals, each of the plurality of control input nodes to a respective signal from among the plurality of signals. The reconnecting changes a number of control input nodes connected to the first tuning signal but leaves unchanged a total number of control input nodes connected to one of the first tuning signal and the second tuning signal.

An embodiment of a tunable oscillator disclosed herein includes a resonance circuit, a negative impedance structure operably coupled to the resonance circuit, and a variable reactance apparatus operably coupled to the resonance circuit and configured for tuning of the oscillator. The variable reactance apparatus includes a plurality of unit variable reactance structures connected in parallel, where each of the plurality of unit variable reactance structures includes a respective one of a plurality of control input nodes. The variable reactance apparatus also includes a control circuit operably coupled to the plurality of unit variable reactance structures and configured to selectively connect, based on one or more selection signals, each of the plurality of control input nodes to a respective signal from among a plurality of signals, where the plurality of signals comprises a first tuning signal and a second tuning signal. In a further embodiment of the oscillator, the plurality of signals also includes an off-state control signal. In another embodiment, the resonator circuit includes an LC tank circuit and the negative impedance structure includes a cross-coupled transistor pair.

In another embodiment of the oscillator, each unit variable reactance structure within the plurality of unit variable reactance structures includes a respective one of a plurality of pairs of AC coupling capacitors and respective one of a plurality of bias signal nodes. In this embodiment the control circuit is further configured to connect an on-state bias signal to each bias signal node within a unit variable reactance structure having its respective control input node connected to the first tuning signal or the second tuning signal. In a further embodiment, the plurality of signals also includes an off-state control signal, and the control circuit is further configured to connect an off-state bias signal to each bias signal node within a unit variable reactance structure having its respective control input node connected to the off-state control signal. In another embodiment of the oscillator, the first tuning signal includes a modulation voltage associated with a high-pass path in a frequency synthesizer circuit and the second tuning signal includes a tuning voltage associated with a low-pass path in the frequency synthesizer circuit.

An embodiment of a method for changing a gain associated with an input signal of a tunable oscillator, where the oscillator includes a variable reactance apparatus including a plurality of unit variable reactance structures connected in parallel, includes connecting a first tuning signal to control input nodes of a first set of unit variable reactance structures within the plurality of unit variable reactance structures. Each of the unit variable reactance structures comprises a control input node, and the first set includes a first number of unit variable reactance structures. The embodiment of the method also includes connecting a second tuning signal to control input nodes of a second set of unit variable reactance structures within the plurality of unit variable reactance structures, where the second set includes a second number of unit variable reactance structures. The embodiment further includes subsequently altering connections of the first tuning signal and the second tuning signal to change the first and second numbers of unit variable reactance structures while holding constant a sum of the first and second numbers of unit variable reactance structures.

In a further embodiment, the method also includes connecting an off-state control signal to control input nodes of a third set of unit variable reactance structures within the plurality of unit variable reactance structures. In another embodiment, each of the unit variable reactance structures within the plurality of unit variable reactance structures comprises a respective one of a plurality of pairs of AC coupling capacitors and a respective one of a plurality of bias signal nodes. In this embodiment the method further includes connecting an on-state bias signal to each bias signal node of a unit variable reactance structure within the first set or second set of unit variable reactance structures. In a further embodiment, the method also includes connecting an off-state control signal to control input nodes of a third set of unit variable reactance structures and connecting an off-state bias signal to each bias signal node within the third set of unit variable reactance structures.

In another embodiment, connecting the first tuning signal to control input nodes of the first set of unit variable reactance structures and connecting the second tuning signal to control input nodes of the second set of unit variable reactance structures include setting a value of a respective first selection signal associated with each unit variable reactance structure in the plurality of unit variable reactance structures. In this embodiment, connecting the first tuning signal includes setting a first value of the first selection signal and connecting the second tuning signal comprises setting a second value of the first selection signal. In a further embodiment, connecting the first tuning signal and connecting the second tuning signal also include setting a first value of a respective second selection signal associated with each unit variable reactance structure. In a still further embodiment, the method further includes connecting an off-state control signal to control input nodes of a third set of unit variable reactance structures within the plurality of unit variable reactance structures, where connecting the off-state control signal includes setting a second value of the respective second selection signal associated with each unit variable reactance structure.

A variable reactance apparatus, tunable oscillator and method for changing a gain associated with an input signal of a tunable oscillator are disclosed. An embodiment of the variable reactance apparatus comprises a plurality of unit variable reactance structures comprising respective control input nodes, and a control circuit configured to connect each of the control input nodes to a respective signal from among a plurality of signals comprising a first tuning signal and a second tuning signal. An embodiment of a tunable oscillator comprises a resonance circuit, a negative impedance structure and a variable reactance apparatus configured for tuning of the oscillator. An embodiment of a method comprises altering connections of first and second tuning signals to control input nodes of respective first and second sets of unit variable reactance structures while holding constant a sum of the number of unit variable reactance structures in the first and second sets.

Although the present disclosure includes several embodiments, the invention is not intended to be limited to the specific forms set forth herein. On the contrary, it is intended to cover such alternatives, modifications, and equivalents as can be reasonably included within the scope of the invention as defined by the appended claims.

The invention claimed is:

1. A variable reactance apparatus, the apparatus comprising:
 a plurality of unit variable reactance structures connected in parallel, wherein each of the plurality of unit variable reactance structures comprises a respective one of a plurality of control input nodes; and
 a control circuit operably coupled to the plurality of unit variable reactance structures and configured to selectively connect, based on one or more selection signals, each of the plurality of control input nodes to a respective signal from among a plurality of signals, wherein the plurality of signals comprises a first tuning signal and a second tuning signal, wherein:
the control circuit comprises a plurality of multiplexers; and
each of the plurality of multiplexers comprises one or more multiplexer select inputs connected to respective signals from among the one or more selection signals.

2. The apparatus of claim 1, wherein the plurality of signals further comprises an off-state control signal.

3. The apparatus of claim 1, wherein each of the unit variable reactance structures comprises a variable capacitor structure.

4. A variable reactance apparatus, the apparatus comprising:
a plurality of unit variable reactance structures connected in parallel, wherein each of the plurality of unit variable reactance structures comprises a respective one of a plurality of control input nodes; and
a control circuit operably coupled to the plurality of unit variable reactance structures and configured to selectively connect, based on one or more selection signals, each of the plurality of control input nodes to a respective signal from among a plurality of signals, wherein the plurality of signals comprises a first tuning signal, a second tuning signal, and an off-state control signal, wherein:
each unit variable reactance structure within the plurality of unit variable reactance structures comprises
a respective one of a plurality of pairs of alternating current (AC) coupling capacitors, and
a respective one of a plurality of bias signal nodes; and
the control circuit is further configured to connect an on-state bias signal to each bias signal node within a unit variable reactance structure having its respective control input node connected to the first tuning signal or the second tuning signal, and connect an off-state bias signal to each bias signal node within a unit variable reactance structure having its respective control input node connected to the off-state control signal.

5. The apparatus of claim 4, wherein:
the control circuit comprises a plurality of multiplexers; and
each of the plurality of multiplexers comprises one or more multiplexer select inputs connected to respective signals from among the one or more selection signals.

6. The apparatus of claim 1, wherein the control circuit is further configured to selectively reconnect, based on the one or more selection signals, each of the plurality of control input nodes to a respective signal from among the plurality of signals, wherein the reconnecting changes a number of control input nodes connected to the first tuning signal but leaves unchanged a total number of control input nodes connected to one of the first tuning signal and the second tuning signal.

7. A tunable oscillator, comprising:
a resonance circuit;
a negative impedance structure operably coupled to the resonance circuit; and
a variable reactance apparatus operably coupled to the resonance circuit and configured for tuning of the oscillator, wherein the variable reactance apparatus comprises
a plurality of unit variable reactance structures connected in parallel, wherein each of the plurality of unit variable reactance structures comprises a respective one of a plurality of control input nodes, and
a control circuit operably coupled to the plurality of unit variable reactance structures and configured to selectively connect, based on one or more selection signals, each of the plurality of control input nodes to a respective signal from among a plurality of signals, wherein the plurality of signals comprises a first tuning signal and a second tuning signal, wherein:
the first tuning signal comprises a modulation voltage associated with a high-pass path in a two-point injection frequency synthesizer circuit; and
the second tuning signal comprises a tuning voltage associated with a low-pass path in the two-point injection frequency synthesizer circuit.

8. The oscillator of claim 7, wherein
the resonance circuit comprises an inductor-capacitor (LC) tank circuit; and
the negative impedance structure comprises a cross-coupled transistor pair.

9. A method for changing a gain associated with an input signal of a tunable oscillator, wherein the oscillator comprises a variable reactance apparatus comprising a plurality of unit variable reactance structures connected in parallel, and each of the unit variable reactance structures within the plurality of unit variable reactance structures comprises a respective one of a plurality of pairs of AC coupling capacitors and a respective one of a plurality of bias signal nodes, the method comprising:
connecting a first tuning signal to control input nodes of a first set of unit variable reactance structures within the plurality of unit variable reactance structures, wherein each of the plurality of unit variable reactance structures comprises a respective control input node, and the first set comprises a first number of unit variable reactance structures;
connecting a second tuning signal to control input nodes of a second set of unit variable reactance structures within the plurality of unit variable reactance structures, wherein the second set comprises a second number of unit variable reactance structures;
subsequently altering connections of the first tuning signal and second tuning signal to change the first and second numbers of unit variable reactance structures while holding constant a sum of the first and second numbers of unit variable reactance structures,
connecting an on-state bias signal to each bias signal node of a unit variable reactance structure within the first set or second set of unit variable reactance structures;
connecting an off-state control signal to control input nodes of a third set of unit variable reactance structures within the plurality of unit variable reactance structures; and
connecting an off-state bias signal to each bias signal node within the third set of unit variable reactance structures.

10. The method of claim 9, further comprising connecting an off-state control signal to control input nodes of a third set of unit variable reactance structures within the plurality of unit variable reactance structures.

11. The method of claim 9, wherein
connecting the first tuning signal to control input nodes of the first set of unit variable reactance structures and connecting the second tuning signal to control input nodes of the second set of unit variable reactance structures comprise setting a value of a respective first selection signal associated with each unit variable reactance structure in the plurality of unit variable reactance structures;

connecting the first tuning signal comprises setting a first value of the first selection signal; and connecting the second tuning signal comprises setting a second value of the first selection signal.

12. The oscillator of claim 7, wherein the plurality of signals further comprises an off-state control signal.

13. A tunable oscillator, comprising:

a resonance circuit;

a negative impedance structure operably coupled to the resonance circuit; and a variable reactance apparatus operably coupled to the resonance circuit and configured for tuning of the oscillator, wherein the variable reactance apparatus comprises a plurality of unit variable reactance structures connected in parallel, wherein each of the plurality of unit variable reactance structures comprises a respective one of a plurality of control input nodes, and a control circuit operably coupled to the plurality of unit variable reactance structures and configured to selectively connect, based on one or more selection signals, each of the plurality of control input nodes to a respective signal from among a plurality of signals, wherein the plurality of signals comprises a first tuning signal, a second tuning signal, and an off-state control signal, wherein:

each of the unit variable reactance structures within the plurality of unit variable reactance structures comprises a respective one of a plurality of pairs of AC coupling capacitors, and a respective one of a plurality of bias signal nodes; and the control circuit is further configured to connect an on-state bias signal to each bias signal node within a unit variable reactance structure having its respective control input node connected to the first tuning signal or the second tuning signal, and connect an off-state bias signal to each bias signal node within a unit variable reactance structure having its respective control input node connected to the off-state control signal.

14. The method of claim 11, wherein connecting the first tuning signal and connecting the second tuning signal further comprise setting a first value of a respective second selection signal associated with each unit variable reactance structure.

15. The method of claim 14, further comprising connecting an off-state control signal to control input nodes of a third set of unit variable reactance structures within the plurality of unit variable reactance structures, wherein connecting the off-state control signal comprises setting a second value of the respective second selection signal associated with each unit variable reactance structure.

16. The apparatus of claim 4, wherein the plurality of signals further comprises an off-state control signal.

17. The apparatus of claim 4, wherein each of the unit variable reactance structures comprises a variable capacitor structure.

18. The apparatus of claim 4, wherein the control circuit is further configured to selectively reconnect, based on the one or more selection signals, each of the plurality of control input nodes to a respective signal from among the plurality of signals, wherein the reconnecting changes a number of control input nodes connected to the first tuning signal but leaves unchanged a total number of control input nodes connected to one of the first tuning signal and the second tuning signal.

19. The oscillator of claim 13, wherein the resonance circuit comprises an inductor-capacitor (LC) tank circuit; and the negative impedance structure comprises a cross-coupled transistor pair.

* * * * *